United States Patent [19]

Borkenhagen et al.

[11] Patent Number: 5,067,105
[45] Date of Patent: Nov. 19, 1991

[54] SYSTEM AND METHOD FOR AUTOMATICALLY CONFIGURING TRANSLATION OF LOGICAL ADDRESSES TO A PHYSICAL MEMORY ADDRESS IN A COMPUTER MEMORY SYSTEM

[75] Inventors: John M. Borkenhagen; Quentin G. Schmierer; Charles P. Geer, all of Rochester, Minn.

[73] Assignee: International Business Machines Corporation, Armonk, N.Y.

[21] Appl. No.: 120,884

[22] Filed: Nov. 16, 1987

[51] Int. Cl.$^5$ .............................................. G06F 11/00
[52] U.S. Cl. .................................... 395/400; 371/10.2; 364/921.8; 364/921.9; 364/942.7; 364/942.8; 364/943.9; 364/943.91; 364/944; 364/944.7; 364/914.92; 364/945; 364/953; 364/954; 364/961; 364/965; 364/970; 364/DIG. 2
[58] Field of Search ............... 364/200 MS, 900 MS; 371/22, 10.1, 10.2

[56] References Cited

U.S. PATENT DOCUMENTS

| | | | |
|---|---|---|---|
| 3,781,826 | 12/1973 | Beausoleil | 371/2.2 |
| 4,028,539 | 6/1977 | Jacobs | 371/10.2 |
| 4,051,460 | 9/1977 | Pamada et al. | 364/900 |
| 4,070,704 | 1/1978 | Calle et al. | 364/200 |
| 4,506,364 | 3/1985 | Aichelmann, Jr. et al. | 371/2.2 |
| 4,507,730 | 3/1985 | Johnson et al. | 364/200 |
| 4,534,029 | 8/1985 | Singh et al. | 371/2.2 |

Primary Examiner—Stuart N. Hecker
Assistant Examiner—Rebecca L. Rudolph
Attorney, Agent, or Firm—Hugh D. Jaeger

[57] ABSTRACT

A system for altering physical addresses of semiconductor memory cards to locate an error-free portion to provide a contiguous range of storage which is free from errors. The system contains a memory card ID register which stores the physical addresses of memory cards in positions corresponding to logical addresses. The system evaluates the results of routine tests of memory and rearranges the physical addresses stored in the memory card ID register to provide an error-free portion at the desired logical address range. A separate memory configuration register stores a value representing the size of the memory cards. The value stored in the memory configuration register selects a subset of the logical memory address bits to obtain a logical card address. The logical card address selects a position in the memory card ID register to obtain the physical address of the memory card.

7 Claims, 3 Drawing Sheets

SYSTEM AND METHOD FOR AUTOMATICALLY CONFIGURING TRANSLATION OF LOGICAL ADDRESSES TO A PHYSICAL MEMORY ADDRESS IN A COMPUTER MEMORY SYSTEM

TECHNICAL FIELD

This invention relates to a system for rearranging the logical address of semiconductor memory cards to create an error free section of memory beginning with the lowest logical address and extending upwardly to include sufficient capacity to accommodate the storage of the portion of the operating system which must be located in an error free portion of memory.

BACKGROUND ART

The availability of inexpensive semiconductor memory has made it possible to provide computing systems which are vastly more powerful, but nevertheless smaller and less expensive than their predecessors. While such memory has significantly contributed to the advancement of the computer art, it is not without problems. For example, the manufacturing techniques used to fabricate such memory are not capable of yielding completely error free chips in sufficient quantity to make it economically feasible to discard those with only a few defects. Various techniques have been employed to accommodate this inadequacy. Extra storage positions to replace those found to be defective and automatic reassignment of the bad addresses to another location are examples of such approaches to the problem.

While these approaches are effective for most of the general purpose storage requirements in computing systems, there are occasions where it is necessary to have a completely error free portion of memory. Generally, this portion must extend from the very lowest memory address in unbroken fashion, to the highest address required to provide the requisite storage capacity. An example of such a requirement exists in the IBM System 38. The System 38 uses an area of storage for predetermined tasks whose addresses are based on pointers, and cannot tolerate a bad area of storage. The requirement that the Control Address Table and the Primary Directory be free from uncorrectable errors was handled by service personnel during installation of the system. The results of memory test were evaluated by the person doing the installation and memory cards were replugged to provide the requisite error free storage at the desired addresses.

The problem is complicated on systems which utilize paired memory cards. This may require that a good card paired with a bad one must be removed along with the bad one when the replugging is done.

The traditional "installation" of a computer system by skilled service personnel has become a thing of the past for all but the largest computer systems. The size of the typical computing system has become such that the customer may actually carry the computer from the store, and the cost has been correspondingly reduced to the point where the added expense of service personnel for installation is no longer economically feasible.

The memory test, unplugging and replugging of memory cards and reconfiguration formerly performed by trained service personnel are far too complex to be performed by the average customer.

Attempts to solve this problem have been ineffective. While the memory test operation has been effectively automated, and improvements made in the substitutability of memory cards; for example, paired cards can be exchanged by operation of a switch instead of physically interchanging them; a comprehensive approach to the entire problem has been lacking.

Various systems and techniques for testing memory have been shown in *IBM Technical Disclosure Bulletin*, 1979, Vol. 11, pp. 2377-2379; *IBM Technical Disclosure Bulletin*, 1981, Vol. 12, p. 3268; *IBM Technical Disclosure Bulletin*, 1982, Vol. 1, pp. 4417-4424; *IBM Technical Disclosure Bulletin*, 1984, Vol. 5, pp. 5996-6000; *IBM Technical Disclosure Bulletin*, 1984, Vol. 9, pp. 2045-2046; *IBM Technical Disclosure Bulletin*: 1986, Vol. p. 2390; *IBM Technical Disclosure Bulletin*, 1987, Vol. 1, pp. 3474-3475; and *IBM Technical Disclosure Bulletin*, 1987, Vol. 1, pp. 3622-3625.

U.S. Pat. No. 4,070,704 relates to a system in which the initial program load of a system is reinitiated in the event of failure to properly complete. If the system fails to boot properly, it is reconfigured and another IPL is attempted. The configuration organization is determined by the state of a sequential counter. The system steps through all possible configurations until one is found which allows the IPL to proceed to successful completion.

U.S. Pat. No. 4,507,730 deals with the problems of reconfiguring memory serviced by a controller to provide a contiguous error-free portion by rearranging the memory serviced by the controller to place the bad bit positions at the upper portion of that memory. Each controller can be reconfigured to respond to a different address on the address bus, which requires that a reconfiguration command be issued to all the controllers and special purpose circuitry be located in each controller to implement this command.

DISCLOSURE OF THE INVENTION

It is therefore an object of this invention to provide a memory address translation system which responds to the output of a memory test to reconfigure the memory with the desired increment error free locations.

It is another object of the invention to provide a memory address translation system which ensures an adequate amount of contiguous error free memory without introducing substantial delay or additional hardware into the system.

It is still another object of the invention to provide a computer system memory in which adequate error free memory is available to the operating system through an address translation system which changes logical memory addresses to physical memory addresses without substantial delay or additional hardware.

According to one aspect of the invention, there is provided a memory card identification register which is addressed according to the logical address of the desired memory location and generates a physical address corresponding to the actual location of the data. The address stored in the memory card identification register is based on the test information obtained when the system memory is evaluated for errors. The memory cards which test out error free are assigned the lower address locations.

The foregoing and other objects, features and advantages of the invention will be apparent from the following more particular description of the invention as illustrated in the accompanying drawings.

DESCRIPTION OF THE INVENTION

U.S. Pat. No. 4,218,743 and U.S. Pat. No. 4,277,826 are incorporated herein by reference.

The system of this invention is designed to be placed in the path over which the logical memory address is passed to the memory address register. In the context of the description herein, the address specified by a central processing unit for the access of data or program information is considered the logical address. The physical location of the data in memory is referred to as the physical address. The physical address is obtained from the logical address by a translation according to the invention.

Figure 1:
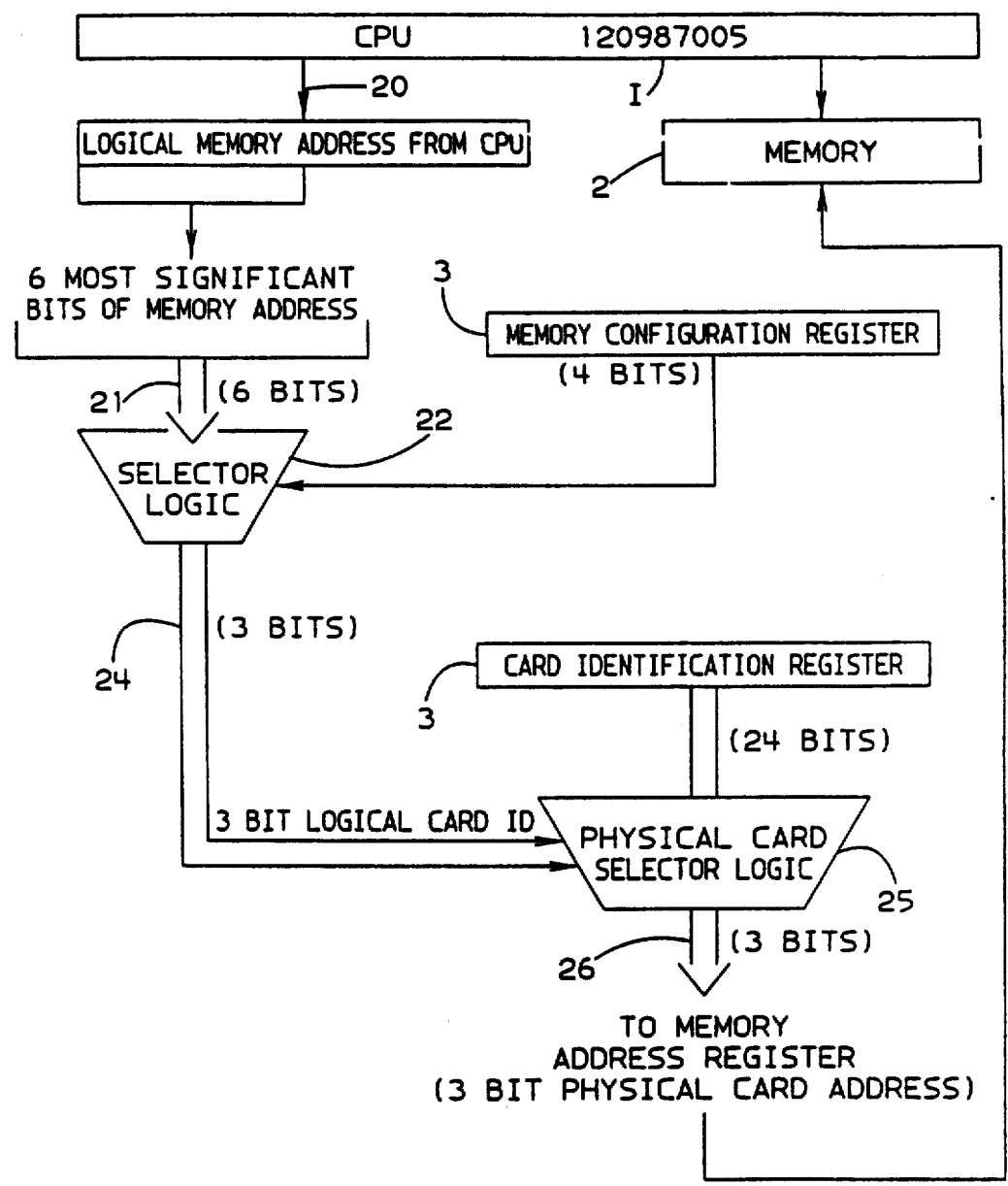
FIG. 1 is a system drawing of the invention showing the manner in which the logical memory address is modified to provide the physical address.
Figure 3:
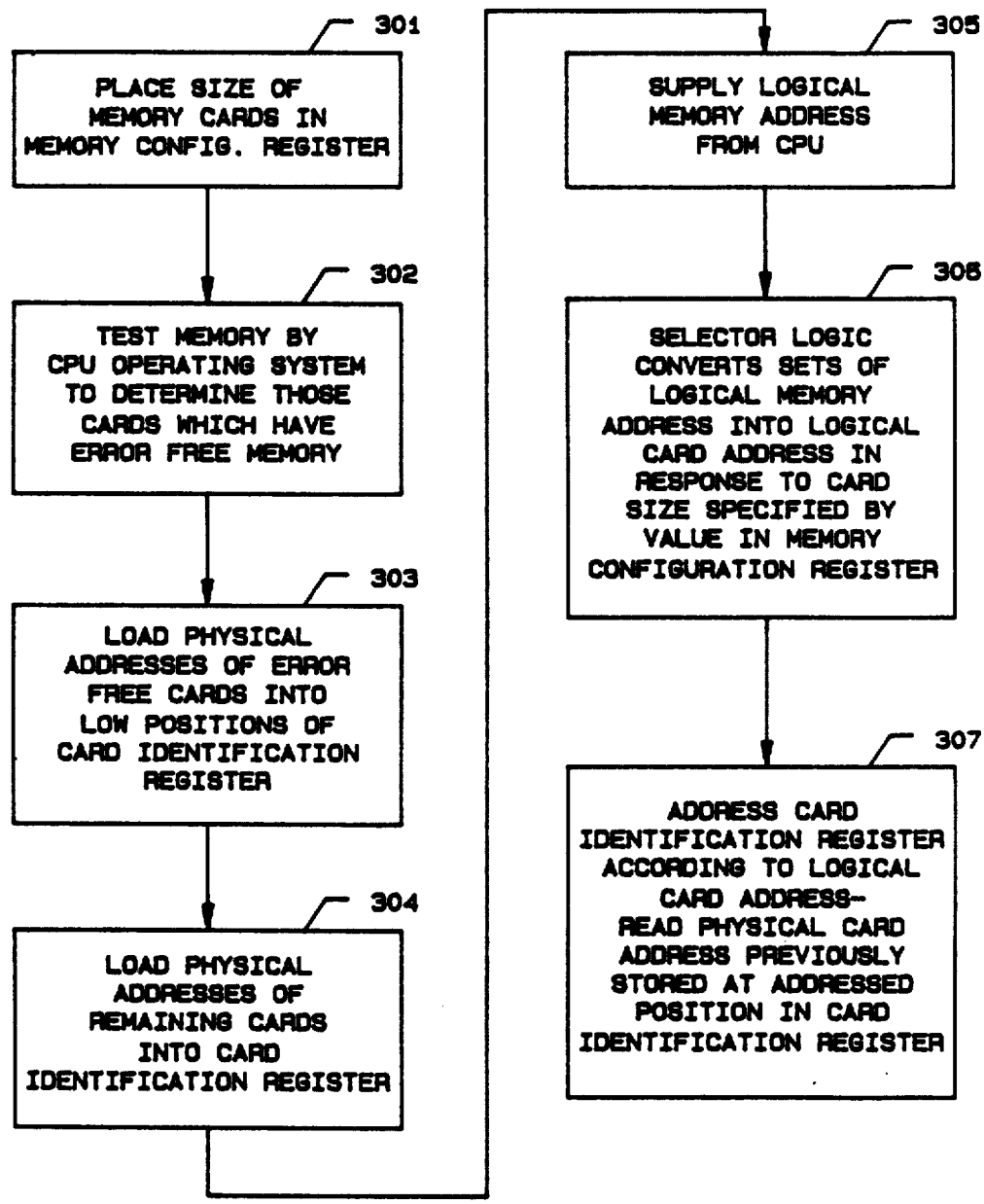
FIG. 3 is a flowchart showing the operation of the invention.

With reference to FIG. 1, the central processing unit 1 causes the information, the size of the memory cards installed in the system memory 2 to be placed in memory configuration register 3 (FIG. 3 step 301). This information can either be specified by switches set at the time of manufacture or can be obtained by the system from data on the memory card after an operation such as reading vital product data. In this fashion, memory cards containing 2, 4, 8, 12, 16, 32 and 64 megabytes of information can be accommodated.

The memory 2 is tested by the operating system of the CPU to determine those cards which have error free memory (FIG. 3 step 302). Such testing techniques are well known. When the error free cards have been identified by their physical address in the memory, the operating system loads the physical addresses, beginning at the lowest position, into card identification register 4 (FIG. 3 /Step 303).

Figure 2:
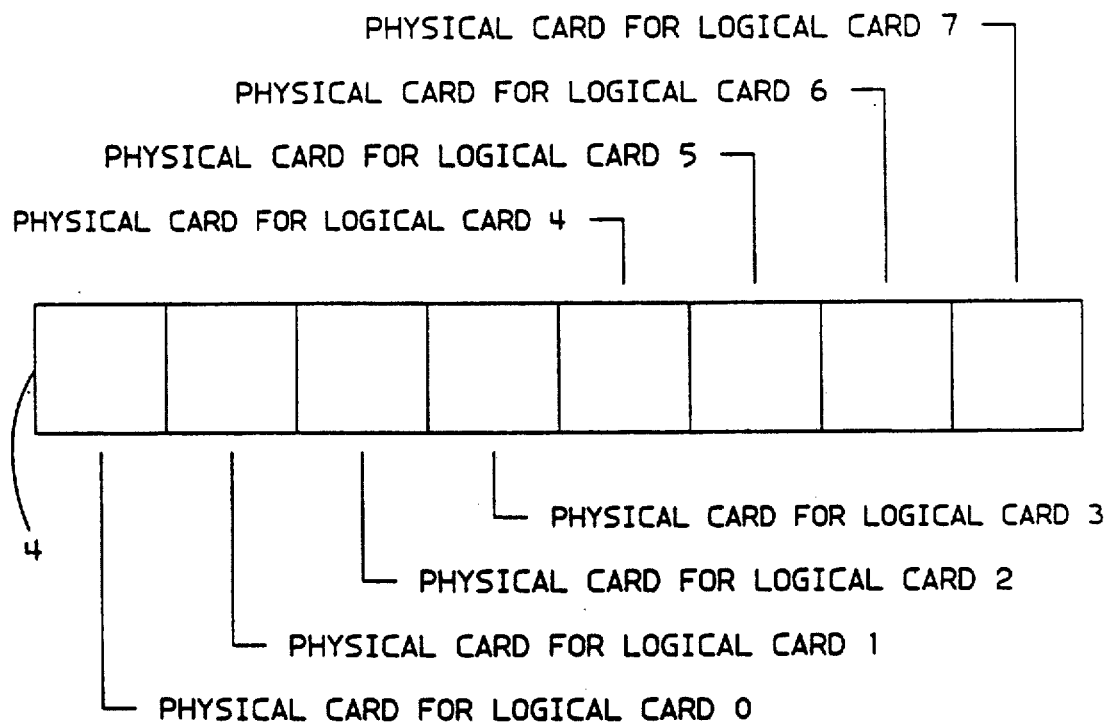
FIG. 2 a detailed drawing of the format of the card identification register used in the invention.

The organization of card identification register 4 is shown in more detail in FIG. 2. This register has 24 positions for a system in which 8 memory cards are used. The first 3-bit position, logical Card 0, is loaded with the physical address of a memory card found to have no errors. The next 3-bit position, logical Card 1, is loaded with the physical address of another memory card which has been found to have no errors. The loading of memory configuration register 4 continues in this fashion until the physical addresses of all cards having no errors have been stored. The then remaining logical card positions are then loaded with the physical addresses of those cards found to have errors, but which are suitable for general computing use through error correction or similar techniques (FIG. 3 Step 304).

The operation of the system proceeds in real time. The logical memory address from the CPU 1 is supplied over a memory address bus 20 (FIG. 3 Step 305). The 6 most significant bits of this address, on bus 21, are applied to selector logic 22. This logic, which operates in real time, converts the 6 high order bits of the logical memory address into a 3-bit logical card address on bus 24 (FIG. 3 Step 306). The selector logic operates in response to the size of the individual memory cards, as specified by the value in memory configuration register 3. The 3-bit output on bus 24, representing the logical card address, is fed to physical card selector logic, where it is operated on in real time by the data in card identification register 4.

In effect, the physical card selector logic 25 operates to address the card identification register 4 according to the logical card address. The physical card address, previously stored at that position in register 4 is then read from the register and placed on output bus 26, leading to the physical memory address register (FIG. 3 Step 307).

If desired, the operating system can check the amount of error free memory to ensure that sufficient space is available to satisfy the needs of the system. The operating system may also determine whether memory cards are installed in the physical slot, and prevent the system from attempting to access addresses for which no card exists Of particular significance is the fact that the address translation from logical to physical is done in real time by only two levels of logic. This does not result in significant degredation of system performance. Further, by using the same logic to convert all memory addresses, the requirement for additional hardware is minimized.

It will be appreciated that the invention can be implemented in various fashions. While the memory configuration register 3 and the card identification register 4 have been shown as implemented in hardware, they could also be located in memory. Similarly, the hardware card selector logic 22 and the physical card selector logic 25 are shown in hardware, they could as well be implemented in software. The particular form of implementation will be dependent on the system performance requirements and the economics of the application.

Other departures from the specific embodiment described herein may be made without departing from the spirit and scope of the invention.

We claim:

1. A method for automatically configuring the translation of a logical memory address to a physical memory address in a computer system, comprising the steps of:
   a. testing cards containing memory to identify those cards providing error free operation;
   b. storing the physical addresses of the cards so tested and providing error free operation in a card identification register at locations corresponding to a logical address range;
   c. reading identification data on said memory cards to determine the number of storage addresses on each card;
   d. translating a first portion of the logical memory address to a logical card address based on the identification data;
   e. accessing said register with said logical card address to obtain therefrom a physical card address; and
   f. combining said physical card address with a second portion of said logical memory address to obtain therefrom a physical memory address.

2. A method according to claim 1 wherein the step of accessing said card identification register is done with the logical card address.

3. The method of claim 2 performed in real time for each memory access with only two levels of logic.

4. An apparatus for automatically configuring a logical memory address to physical memory address translator in a computer system having a plurality of memory cards, wherein each of said plurality of memory cards contains identification data specifying the number of storage addresses thereon, and wherein said system has means for testing, each card to identify those cards providing error free operation, said apparatus comprising:
- a. memory configuration means for storing the value representing the number of storage addresses on each memory card;
- b. first logic means coupled to said memory configuration means for modifying a portion of said logical memory address to provide a logical card address;
- c. card identification means, responsive to the results of said test to identify those cards providing, error free operation, for storing the physical address of a logical card; and
- d. second logic means, operating in real time for each memory access and in response to said card identification means for translating said modified logical card address to a physical card address.

5. The apparatus automatically configuring a logical memory address to physical memory address translator of claim 4,
wherein said card identification means comprises a card identification register, said register comprising a plurality of positions, each position corresponding to the logical address of a memory card and storing the physical address of that memory card; and
wherein said second logic means comprises a single level of selector logic, said selector logic selecting one of the plurality of positions in said card identification register corresponding to the logical card address received from the first logic means, and providing the physical card address stored in said position.

6. The apparatus for automatically configuring a logical memory address to physical memory address translator of claim 5, wherein said first logic means comprises a single level of selector logic, said selector logic selecting a subset of address bits contained in said logical memory address to provide said logical card address.

7. The apparatus for automatically configuring a logical memory address to physical memory address translator of claim 4, wherein said first logic means comprises a single level of selector logic, said selector logic selecting a subset of address bits contained in said logical memory address to provide said logical card address.

* * * * *